(12) United States Patent
Moon et al.

(10) Patent No.: US 9,634,153 B2
(45) Date of Patent: Apr. 25, 2017

(54) SENSOR USING SENSING MECHANISM HAVING COMBINED STATIC CHARGE AND FIELD EFFECT TRANSISTOR

(71) Applicant: POSTECH ACADEMY-INDUSTRY FOUNDATION, Pohang-si (KR)

(72) Inventors: Won Kyu Moon, Pohang-si (KR); James Edward West, Baltimore, MD (US); Min Sung, Pohang-si (KR); Yub Je, Busan (KR); Kum Jae Shin, Daegu (KR)

(73) Assignee: POSTECH ACADEMY-INDUSTRY FOUNDATION, Pohang-si (KR)

( * ) Notice: Subject to any disclaimer, the term of this patent is extended or adjusted under 35 U.S.C. 154(b) by 70 days.

(21) Appl. No.: 14/399,279

(22) PCT Filed: Apr. 30, 2013

(86) PCT No.: PCT/KR2013/003727
§ 371 (c)(1),
(2) Date: Nov. 6, 2014

(87) PCT Pub. No.: WO2013/168922
PCT Pub. Date: Nov. 14, 2013

(65) Prior Publication Data
US 2015/0115331 A1 Apr. 30, 2015

(30) Foreign Application Priority Data

May 11, 2012 (KR) ........................ 10-2012-0050418

(51) Int. Cl.
*H01L 29/84* (2006.01)
*B81B 3/00* (2006.01)
(Continued)

(52) U.S. Cl.
CPC ............ *H01L 29/84* (2013.01); *B81B 3/0021* (2013.01); *G01L 9/008* (2013.01); *G01L 9/0072* (2013.01);
(Continued)

(58) Field of Classification Search
None
See application file for complete search history.

(56) References Cited

U.S. PATENT DOCUMENTS

| | | | |
|---|---|---|---|
| 2007/0134835 A1* | 6/2007 | Fukuda ............... | H01H 59/0009 438/48 |
| 2011/0243350 A1* | 10/2011 | Miller .................. | H04R 23/006 381/111 |
| 2011/0249834 A1* | 10/2011 | Takaoka ................ | H01G 7/028 381/191 |

FOREIGN PATENT DOCUMENTS

| JP | 01-005075 | 1/1989 |
|---|---|---|
| JP | 07-030128 | 1/1995 |
| JP | 2007-227850 | 9/2007 |

* cited by examiner

*Primary Examiner* — Robert Bachner
*Assistant Examiner* — Molly Reida
(74) *Attorney, Agent, or Firm* — Lex IP Meister, PLLC

(57) ABSTRACT

The present invention relates to a sensor that uses a sensing mechanism having a combined static charge and a field effect transistor, the sensor including: a substrate; source and drain units formed on the substrate and separated from each other; a channel unit interposed between the source and drain units; a membrane separated from the channel unit, disposed on a top portion and displaced in response to an external signal; and a static charge member formed on a bottom surface of the membrane separately from the channel unit and generating an electric field. Accordingly, since the sensor using a sensing mechanism having a combined static charge and a field effect transistor according to an embodiment of the present invention can measure the displacement (Continued)

or movement of the sensor by measuring a change of the electric field of the channel unit of the field effect transistor by using a static member, the electric field can be formed so as to be proportional to an amount of charge and inversely proportional to a squared distance regardless of the intensity and distribution of an external electric field. Therefore, sensitivity is improved without being affected by an external electric field.

5 Claims, 2 Drawing Sheets

(51) Int. Cl.
    *G01P 15/08*     (2006.01)
    *G01L 9/00*     (2006.01)
    *H04R 23/00*     (2006.01)
    *H01L 41/04*     (2006.01)
    *H01L 41/113*     (2006.01)

(52) U.S. Cl.
    CPC .............. *G01P 15/08* (2013.01); *H01L 41/04* (2013.01); *H01L 41/1132* (2013.01); *H04R 23/006* (2013.01); *B81B 2201/0257* (2013.01); *B81B 2201/0264* (2013.01); *H04R 2201/003* (2013.01)

SENSOR USING SENSING MECHANISM HAVING COMBINED STATIC CHARGE AND FIELD EFFECT TRANSISTOR

TECHNICAL FIELD

The present invention relates to a sensor using a mechanism sensing an energy conversion in which a change of mechanical and physical amounts is converted into an electrical signal by combining an electrostatic unit and an electric field effect transistor.

BACKGROUND ART

Most devices include an element converting energy. Particularly, in a case of a sensor, an electrical output is mostly required such that at least one energy conversion is processed within the device. For example, in a case of a capacitive type of microphone that is widely used, displacement of a thin film that is deformed by a pressure wave of a sound changes a capacitance with an electrode positioned near the thin film, and the change of capacitance changes an electrical state that was formed in a balance state by a bias voltage that is initially applied, thereby generating a voltage change or a charge of change amount between the thin film and the electrode. If they are connected to an electric circuit to sense the change of the capacitance, the displacement of the thin film may be estimated therefrom, so this method is connected to the estimation of the sound pressure. Accordingly, correctly converting the change of capacitance into the electrical output is important. To change the electrical state change of the electric element into the electric output, a current is needed such that the correct conversion of the capacitance change into the electrical output signal has a limitation. Particularly, a case using reversible energy conversion may not escape this characteristic. The reversible energy conversion means that an energy conversion direction is a pair of directions, and this includes conversion using a condenser added with the above-proposed bias voltage as well as conversion using a piezoelectric phenomenon.

The energy conversion method that is widely used in the current sensor may be largely classified into a piezoresistive type, a piezoelectric type, an optical type, and a capacitive type. In the piezoelectric type and the capacitive type, the electrical signal corresponding to the final output next to the reversible energy conversion is not free in the dynamics of the sensor. In the piezoresistive type and the optical type, non-reversible energy conversion is easy such that the dynamic of the sensor does not largely affect the accuracy of the signal. Accordingly, in the case of the piezoresistive type of sensor, since the electrical impedance of the mechanical-electrical conversion material is low, there is a merit that an additional interface circuit for the signal measurement of the piezoresistive type of sensor is not needed and the change of the sensitivity according to a frequency is small. Also, a MEMS process technique has been developed for the production to be easy according to the development of a new piezoresistive material, and various researches on the application of the very small pressure sensor and the microphone have been executed. However, due to the low mechanical-electrical conversion efficiency of the piezoresistive material, there is a drawback that the entire sensitivity is relatively low compared with other methods, and a change of the sensitivity of the sensor is largely generated according to temperature.

In the case of the piezoelectric type of sensor, since the output signal having a relatively large size may be obtained without the addition of the bias voltage, it has been largely applied to a sound sensor such as the microphone or a hydrophone until now, however it is the reversible conversion method such that it may be not free from the unique characteristic. Accordingly, since the size of the piezoelectric member used is minutely small if extreme down-sizing is realized, the charge amount that may be generated by the pressure is extremely small such that the conventional circuital measuring method may not satisfy the required sensitivity, the frequency band, and a noise for the signal. Particularly, an increase of electric impedance according to the down-sizing causes deterioration of the low frequency performance.

The capacitive type of sensor is widely applied to a very small pressure sensor, sound sensor, and acceleration-based sensor, however it is the reversible energy conversion like the piezoelectric sensor such that the capacitance of the sensor is extremely small according to the extreme down-sizing, and the sensitivity deterioration effect due to parasitic capacitance appears. To prevent this, the capacitive type of very small sensor integrates the advanced and high performance interface circuit with a single chip shape and is realized with a hybrid packaging method minimizing the parasitic capacitance, according to the high performance and CMOS IC integration of the low noise, and the packaging technique is perched as an important element technology. However, although the sensor and the interface circuit are integrated and the sensitivity is preserved, the capacitive type of sensor may not avoid the deterioration of the sensitivity of the low frequency region and the noise characteristic according to the extreme down-sizing. It is difficult to solve the problem of the low frequency characteristic and the sensitivity due the technical and electrical conversion method of the sensor through the high performance and the optimization of the interface circuit.

The optical type of sensor uses a method of directly measuring mechanical deformation of the sensor sensing portion by an optical method such as Mach-Zehnder interferometry and Fabry-Perot interferometry. The piezoresistive type and this type use non-reversible energy conversion methods such that the limitation of the output signal is not determined by the dynamic of the sensor. However, the optical type of sensor has drawbacks such as the change of sensitivity according to the sensor temperature and the difficult aligning and calibration of optics in spite of the several merits such as the sensitivity.

As described above, the capacitive type and the piezoelectric type adopted in the conventional sensor have the limitation such as the deterioration of the sensitivity and the low frequency performance according to the extreme down-sizing, and the optical type and the piezoresistive type do not have the deterioration of the frequency performance according to the down-sizing, but are different to be itself down-size or have the problem a noise ratio for a signal does not reach a required degree.

DISCLOSURE

Technical Problem

The present invention provides a sensor using a sensing mechanism combining an electrostatic unit and an electric field effect transistor of a new energy conversion method without performance deterioration according to extreme down-sizing.

Technical Solution

A sensor using a sensing mechanism combining an electrostatic unit and an electric field effect transistor according to an exemplary embodiment of the present invention may include: a substrate; a source part and a drain part formed on the substrate and separated from each other; a channel part formed between the source part and the drain part; a membrane separated from the channel part to be positioned upwardly and reacting to an external signal to generate a displacement; and an electrostatic member formed at a lower surface of the membrane to be separated from the channel part and generating an electric field.

The channel part and the electrostatic member may be positioned to overlap.

The source part, the channel part, the drain part, and the electrostatic member may form an electric field effect transistor.

A thickness of both ends of the membrane may be thicker than the thickness of a center part of the membrane.

An insulating part may be formed between the channel part and the electrostatic member.

A shielding member may be formed at an upper surface of the membrane.

The substrate and the membrane may be formed of the same material.

A sensor using a sensing mechanism combining an electrostatic unit and an electric field effect transistor according to another exemplary embodiment of the present invention includes: a substrate; an electrostatic member formed on the substrate and generating an electric field; a membrane separated from the electrostatic member to be positioned upwardly and reacting to an external signal to generate a displacement; a source part and a drain part formed at the membrane and separated from each other; and a channel part formed between the source part and the drain part and separated from the electrostatic member.

The channel part and the electrostatic member may be overlapped.

The source part, the channel part, the drain part, and the electrostatic member may form an electric field effect transistor.

The thickness of both ends of the membrane may be thicker than the thickness of the center part of the membrane.

An insulating part may be formed between the channel part and the electrostatic member.

A shielding member may be formed at an upper surface of the membrane, and the substrate and the membrane may be formed of the same material.

An insulating layer may be formed between the substrate and the electrostatic member, and the insulating layer may extend between the substrate and both ends of the membrane.

A sensor using a sensing mechanism combining an electrostatic unit and an electric field effect transistor according to another exemplary embodiment of the present invention includes: a substrate; a source part and a drain part formed on the substrate and separated from each other; a channel part formed between the source part and the drain part; a piezoelectric member contacting a surface of the channel part and having a bound charge; a membrane separated from the piezoelectric member to be upwardly positioned and reacting to an external signal to generate a displacement; and a transmitting member formed between the piezoelectric member and the membrane and amplifying and transmitting the external signal applied to the membrane to the piezoelectric member.

The channel part and the piezoelectric member may be overlapped.

The source part, the channel part, the drain part, and the piezoelectric member may form an electric field effect transistor.

The thickness of both ends of the membrane may be thicker than the thickness of the center part of the membrane.

An insulating part may be formed between the transmitting member and the substrate, and a shielding member may be formed at an upper surface of the membrane.

Advantageous Effects

The sensor using the sensing mechanism combining an electrostatic unit and an electric field effect transistor according to an exemplary embodiment of the present invention measures the change of the electric field of the channel part of the electric field effect transistor by using the electrostatic member to measure the displacement or the dynamic of the sensor such that the electric field that is proportional to the charge amount and is inversely proportional to the distance regardless of the intensity and the distribution of the external electric field may be formed, thereby improving the sensitivity without the influence of the external electric field.

Further, the conventional sensor using the electrode needs the additional ground electrode to form the electric field, however the sensor using the sensing mechanism combining the electrostatic unit and the electric field effect transistor according to the exemplary embodiment of the present invention does not need the additional ground electrode to form the electric field such that the configuration is simplified.

Also, by using the electric field effect transistor, electrical impedance of a low degree may be maintained in a very small shape such that sensitivity of a low frequency may be obtained.

In addition, the sensor may be sufficiently realized through only the interface circuit of the simple structure by the low electrical impedance and the separate circuit is not needed for the active biasing by using the semi-permanent electrostatic member (the electret) or piezoelectric member, thereby reducing additional power consumption.

Also, the sensor using the sensing mechanism combining the electrostatic unit and the electric field effect transistor according to the exemplary embodiment of the present invention as the method in which the electric field generated by the electrostatic member (the electret) or the bound charge of the piezoelectric member is applied to the electric field effect transistor forms the strong electric field by using the electrostatic unit and the bound charge compared with the conventional sensor using the electric field effect transistor using the electrode, thereby obtaining high sensitivity.

DESCRIPTION OF REFERENCE NUMERALS INDICATING PRIMARY ELEMENTS IN THE DRAWINGS

Figure 1:
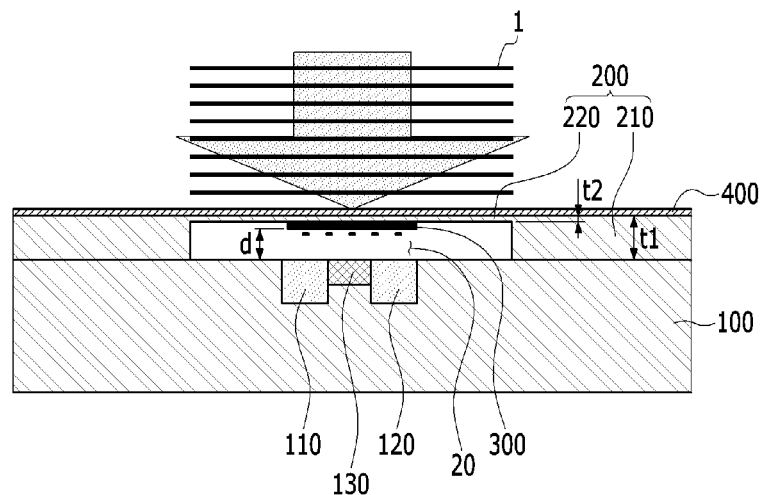
FIG. 1 is a cross-sectional view of a sensor using a sensing mechanism combining an electrostatic unit and an electric field effect transistor according to a first exemplary embodiment of the present invention.

| | |
|---|---|
| 100: substrate | 110: source part |
| 120: drain part | 130: channel part |
| 140: ultrasonic wave absorption plate | 200: membrane |
| 300: electrostatic member | 400: shielding member |
| 500: piezoelectric member | 600: transmitting member |
| 700: insulating layer | 20: insulating part |

Mode for Invention

Hereinafter, the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

A part irrelevant to the description will be omitted to clearly describe the present invention, and the same elements will be designated by the same reference numerals throughout the specification.

Now, a sensor using a sensing mechanism combining an electrostatic unit and an electric field effect transistor according to a first exemplary embodiment of the present invention will be described with reference to FIG. 1.

FIG. 1 is a cross-sectional view of a sensor using a sensing mechanism combining an electrostatic unit and an electric field effect transistor according to a first exemplary embodiment of the present invention.

As shown in FIG. 1, a sensor using a sensing mechanism combining an electrostatic unit and an electric field effect transistor according to a first exemplary embodiment of the present invention includes a substrate 100, a source part 110 and a drain part 120 formed on the substrate 100 and separated from each other, a channel part 130 formed between the source part 110 and the drain part 120, a membrane 200 separated from the channel part 130 and positioned upwardly, and an electrostatic member 300 formed at a lower surface of the membrane 200 and generating an electric field.

The substrate 100 may be a semiconductor substrate formed of a semiconductor. An example of the semiconductor forming the semiconductor substrate may be silicon, gallium arsenide, gallium nitride, zinc oxide, indium phosphide, and silicon carbide. A shape of the substrate is not limited, however it may be formed to be flat.

The channel part 130 is positioned to overlap the electrostatic member 300, and the current flowed into the source part 110 flows to the drain part 120 through the channel part 130 by the electric field generated in the electrostatic member 300.

The electrostatic member 300 is separated from the channel part 130 and is positioned upwardly, and an insulating part 20 is formed between the channel part 130 and the electrostatic member 300. The insulating part 20 is formed of a material having an insulating characteristic, or a solid, a liquid, or a gas, and the insulating part 20 may be formed in vacuum.

The electrostatic member 300 may be an electret, and the electret may be a member permanently holding a charge in the insulator to generate an electric field therearound. The electrostatic member 300 may be charged with a positive charge or a negative charge.

The source part 110, the channel part 130, the drain part 120, and the electrostatic member 300 form an electric field effect transistor. That is, the current flowed into the source part 110 flows to the drain part 120 through the channel part 130 by the electric field generated in the electrostatic member 300.

The membrane 200 may be formed of the same material as the substrate 100, and a thickness t1 of both ends 210 of the membrane 200 is thicker than a thickness t2 of a center portion 220 of the membrane 200. The center portion 220 of the membrane 200 is formed of a thin film such that the membrane 200 has a reaction plate reacting to an external signal thereby easily generating a displacement. The electrostatic member 300 is formed at the lower surface of the center portion 220 of the membrane 200. Accordingly, the displacement is generated in the membrane 200 by an external signal 1 such as a sound wave, and thereby an electric field distance d between the electrostatic member 300 and the channel part 130 is changed by the displacement of the membrane 200. The electric field of the electrostatic member 300 transmitted to the channel part 130 is changed by the change of the electric field distance (d) such that the resistance of the channel part 130 between the source part 110 and the drain part 120 is changed, and as a result, a magnitude of the current flowing to the channel part 130 is changed.

Accordingly, the magnitude of the current flowing to the channel part 130 may be measured to measure the change of the electric field of the channel part 130, thereby measuring the displacement of the membrane 200 and the external signal.

At this time, by considering a frequency band of the sound wave, a mechanical resonance frequency of the membrane 200, that is, the thickness and the area of the membrane 200, may be determined. Also, the material formed at the insulating part or the magnitude of the insulating part 20 may be determined by considering the frequency band and the sensitivity of the sound wave.

A shielding member 400 is formed at the upper surface of the membrane 200 and may be grounded. The shielding member 400 has a shielding function preventing the external electric field from being flowed into the channel part 130.

As described above, the sensor using the sensing mechanism combining the electrostatic unit and the electric field effect transistor according to the first exemplary embodiment of the present invention measures the change of the electric field of the channel part 130 of the electric field effect transistor by using the electrostatic member 300, thereby measuring the displacement or the dynamic of the sensor.

In the conventional sensor using the charged electrode, the amount and the position of the free charged charges in the electrode according to the intensity and the distribution of the external electric field are redisposed according to the potential of the electrode such that the sensor is affected by the external electric field. However, the sensor using the sensing mechanism combining the electrostatic unit and the electric field effect transistor according to the first exemplary embodiment of the present invention using the electrostatic member 300 may form the electric field to be proportional to the charge amount and to be inversely proportional to the distance regardless the intensity and the distribution of the external electric field, such that the sensor is not affected by the external electric field.

Accordingly, in the sensor using the sensing mechanism combining the electrostatic unit and the electric field effect transistor according to the first exemplary embodiment of the present invention, the effect by the external electrode may be disregarded if the external electrode is separated from the channel part 130 rather than the electrostatic member 300, and the electric field formed by the electrostatic member 300 only affects the channel part 130 such that the sensing of the external signal is correct, thereby improving the sensitivity.

Also, the conventional sensor using the electrode needs the additional ground electrode to form the electric field, however the sensor using the sensing mechanism combining the electrostatic unit and the electric field effect transistor according to the first exemplary embodiment of the present invention does not need the additional ground electrode to form the electric field such that the configuration is simplified.

On the other hand, in the case of using the membrane of the sensor using the sensing mechanism combining the electrostatic unit and the electric field effect transistor according to the first exemplary embodiment of the present invention as a sound sensing plate, the sensor using the sensing mechanism combining the electrostatic unit and the electric field effect transistor according to the first exemplary embodiment of the present invention may be used as a microphone or a hydrophone. Also, in a case of adhering a proof mass to the sensor using the sensing mechanism combining the electrostatic unit and the electric field effect transistor according to the first exemplary embodiment of the present invention, the sensor using the sensing mechanism combining the electrostatic unit and the electric field effect transistor according to the first exemplary embodiment of the present invention may be used as an accelerometer.

As described above, the sensor using the sensing mechanism combining the electrostatic unit and the electric field effect transistor according to the first exemplary embodiment of the present invention as a method of directly using the electric field effect transistor as an energy conversion element is a method of directly changing the current of the electric field effect transistor by the change of the electric field generated in the electrostatic unit by directly acting the electric field generated in the electrostatic unit on the gate of the electric field effect transistor, not a method of flowing the additional current or the induced charge as the current to read the state variation change of the energy conversion part. Accordingly, this method may be classified as the non-reversible energy conversion method like the optical type or the piezoresistive type such that the change of the electric field generated from the electrostatic unit by the current of the electric field effect transistor is little affected. Accordingly, in principle, this method does not have the characteristic such as the sensitivity deterioration or the low frequency performance deterioration according to the extreme down-sizing like the capacitive type or the piezoelectric type. Further, the signal to be measured of the current flowing to the electric field effect transistor is detected such that a circuit such as a preamplifier may be easily designed and manufactured, and a single chip production of the sensor and the signal processing circuit is possible based on the semiconductor process. Also, when designing the device to change the intensity of the electric field emitted in the electrostatic unit, a very wide range of physical amounts may be measured.

For example, when measuring the force, in a state of providing electrostaticity to the thin film, in the case that the thin film is deformed by a force, the deformation of the thin film changes the position of the electrostatic unit, and this changes the intensity of the electric field acting on the gate of the electric field effect transistor, such that the current flowing to the transistor is changed. That is, the change of the electric field is caused through the deformation of the thin film installed with the electrostatic unit by the force, and the relation between the force and the deformation of the thin film is the important factor determining the sensitivity of the sensor.

Also, the device may be decorated for the electric field caused by the piezoelectric member receiving the force to directly act on the gate such that the transistor current may be changed according to the force applied to the piezoelectric member as a method.

As described above, the electrostaticity of the sensor using the sensing mechanism combining the electrostatic unit and the electric field effect transistor according to the first exemplary embodiment of the present invention decisively functions to generate the energy conversion. Here, the electrostaticity is used as a means opposed to the free electrons and generally means a charge that is isolated in a state of not to be moved in a solid crystalline structure. The position of the free electrons may be easily changed by the external electric field such that the electric field of the new shape is formed through the interaction with the electric field by the electrode existing in a surrounding environment. However, the electrostatic unit has the function of simply adding the electric field to the conventional electric field such that the change of the electric field by the position change of the electrostatic unit is directly transmitted to the gate region of the electric field effect transistor as it is.

On the other hand, in the first exemplary embodiment, the electrostatic member 300 is formed at the lower surface of the membrane, however a second exemplary embodiment in which the channel part 130 is formed at the membrane and the electrostatic member 300 is formed on the substrate 100 is possible.

Next, a sensor using a sensing mechanism combining an electrostatic unit and an electric field effect transistor according to a second exemplary embodiment of the present invention will be described with reference to FIG. 2.

Figure 2:
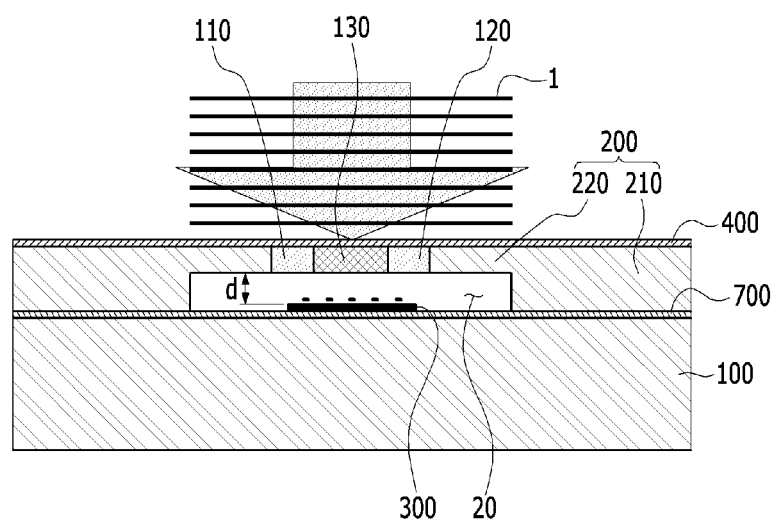
FIG. 2 is a cross-sectional view of a sensor using a sensing mechanism combining an electrostatic unit and an electric field effect transistor according to a second exemplary embodiment of the present invention.

FIG. 2 is a cross-sectional view of a sensor using a sensing mechanism combining an electrostatic unit and an electric field effect transistor according to a second exemplary embodiment of the present invention.

The second exemplary embodiment is substantially the same as the first exemplary embodiment shown in FIG. 1 except for the position of the electrostatic member and the channel part, such that overlapping description is omitted.

As shown in FIG. 2, the sensor using the sensing mechanism combining the electrostatic unit and the electric field effect transistor according to the third exemplary embodiment of the present invention includes the substrate 100, the electrostatic member 300 formed on the substrate 100 and generating the electric field, and the membrane 200 separated from the electrostatic member 300 to be upwardly positioned and acting on the external signal to generate the displacement, the source part 110 and the drain part 120 formed at the membrane 200 and separated from each other, and the channel part 130 formed between the source part 110 and the drain part 120 and separated from the electrostatic member 300.

The electrostatic member 300 and the channel part 130 are positioned to overlap each other, the insulating part 20 is formed between the electrostatic member 300 and the channel part 130, and an insulating layer 700 for shielding the electrostatic member 300 from the outside is formed between the substrate 100 and the electrostatic member 300. The insulating layer 700 is formed to be extended between the substrate 100 and both ends 210 of the membrane 200.

The membrane 200 may be formed of the same material as the substrate 100, and a thickness t1 of both ends 210 of the membrane 200 is thicker than a thickness t2 of a center portion 220 of the membrane 200. The center portion 220 of the membrane 200 is formed of a thin film such that the membrane 200 has a reaction plate reacting to an external signal thereby easily generating a displacement. The channel part 130 is formed at the center part 220 of the membrane 200. Accordingly, the displacement is generated in the membrane 200 by an external signal 1 such as the sound wave, and thereby the channel part 130 is moved and then the electric field distance d between the electrostatic member 300 and the channel part 130 is changed by the displacement of the membrane 200. The electric field of the electrostatic member 300 transmitted to the channel part 130 is changed by the change of the electric field distance (d) such that the resistance between the source part 110 and the drain part 120 is changed, and as a result, the magnitude of the current flowing to the channel part 130 is changed.

Accordingly, the magnitude of the current flowing to the channel part 130 is measured to measure the change of the electric field of the channel part 130, thereby measuring the displacement of the membrane 200 and the external signal.

On the other hand, in the first exemplary embodiment, the electrostatic member is formed to be separated from the channel part, however a third exemplary embodiment in which the piezoelectric member is formed at the channel part surface is possible.

Next, a sensor using a sensing mechanism combining an electrostatic unit and an electric field effect transistor according to a third exemplary embodiment of the present invention will be described with reference to FIG. 3.

Figure 3:
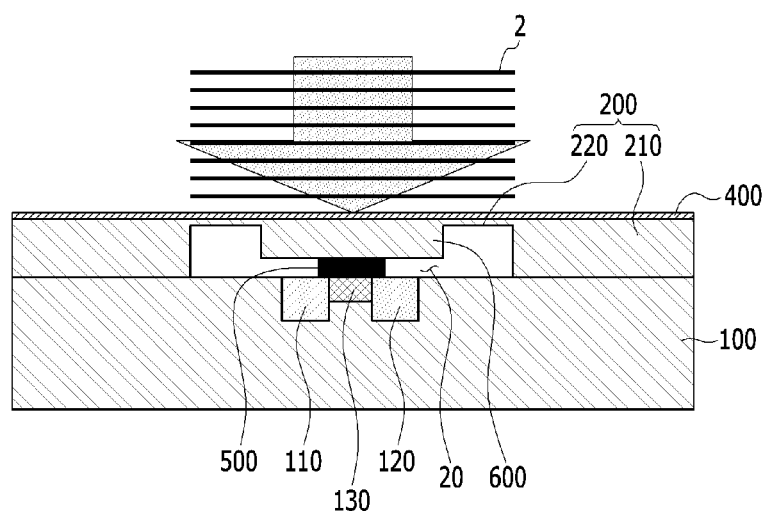
FIG. 3 is a cross-sectional view of a sensor using a sensing mechanism combining an electrostatic unit and an electric field effect transistor according to a third exemplary embodiment of the present invention.

FIG. 3 is a cross-sectional view of a sensor using a sensing mechanism combining an electrostatic unit and an electric field effect transistor according to a second exemplary embodiment of the present invention will be described with reference to FIG. 2.

The third exemplary embodiment is substantially the same as the first exemplary embodiment shown in FIG. 1 except for forming the piezoelectric member and the transmitting member, such that the overlapping description is omitted.

As shown in FIG. 3, the sensor using a sensing mechanism combining an electrostatic unit and an electric field effect transistor according to a second exemplary embodiment of the present invention includes the substrate 100, the source part 110 and the drain part 120 formed on the substrate 100 and separated from each other, the channel part 130 formed between the source part 110 and the drain part 120, a piezoelectric member 500 contacting the surface of the channel part 130, the membrane 200 separated from the piezoelectric member 500 to be upwardly positioned and acting on the external signal to generate the displacement, and a transmitting member 600 formed between the piezoelectric member 500 and the membrane 200 and transmitting the displacement of the membrane 200 to the piezoelectric member 500.

The channel part 130 is positioned to overlap the piezoelectric member 500, and if the piezoelectric member 500 is applied with an external signal 2 such as a pressure, stress, or strain, a bound charge is generated therein. The generated bound charge forms the electric field outside. Accordingly, the current flowed into the source part 110 flows to the drain part 120 through the channel part 130 by the electric field generated in the piezoelectric member 500.

The source part 110, the channel part 130, the drain part 120, and the piezoelectric member 500 form the electric field effect transistor. That is, the current flowed into the source part 110 flows to the drain part 120 through the channel part 130 by the electric field generated in the piezoelectric member 500.

The membrane 200 and the transmitting member may be formed of the same material as the substrate 100, and the thickness of both ends of the membrane 200 is thicker than the thickness of the center part 220 of the membrane 200. The center portion 220 of the membrane 200 is formed of a thin film such that the membrane 200 has a reaction plate reacting to an external signal thereby easily generating a displacement. The transmitting member 600 is formed at the lower surface of the center portion 220 of the membrane 200. The transmitting member 600 has the function of amplifying and transmitting the pressure by the displacement of the membrane 200 to the piezoelectric member 500. Accordingly, the displacement is generated at the membrane 200 by the external signal such as the pressure and the pressure is transmitted to the piezoelectric member 500 through the transmitting member 600 by the displacement of the membrane 200, thereby generating the electric field to the piezoelectric member 500. Accordingly, the electric field transmitted to the channel part 130 is generated by the change of the electric field generated to the piezoelectric member 500 such that the resistance of the channel part 130 between the source part 110 and the drain part 120 is changed, and thereby the magnitude of the current flowing to the channel part 130 is changed.

Accordingly, the magnitude of the current flowing to the channel part 130 may be measured to measure the change of the electric field of the channel part 130, and thereby the stress or strain applied to the piezoelectric member 500 may be measured.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A sensor using a sensing mechanism combining an electrostatic unit and an electric field effect transistor, comprising:
   a substrate;
   a source part and a drain part disposed inside the substrate and separated from each other;
   a channel part formed between the source part and the drain part;
   a membrane separated from the channel part to be positioned upwardly and reacting to an external signal to generate a displacement;

an electrostatic member formed at a lower surface of the membrane to be separated from the channel part and generating an electric field; and a shielding member covering and contacting a center portion of the membrane, wherein a thickness of both ends of the membrane is thicker than the thickness of the center part of the membrane and a center part of the shielding member corresponds to the electrostatic member, and wherein the electric field of the electrostatic member is configured to affect only the channel part.

2. The sensor of claim 1, wherein
the channel part and the electrostatic member are positioned to overlap.

3. The sensor of claim 2, wherein
the source part, the channel part, the drain part, and the electrostatic member form an electric field effect transistor.

4. The sensor of claim 2, wherein
an insulating part is formed between the channel part and the electrostatic member.

5. The sensor of claim 2, wherein
the substrate and the membrane are formed of the same material.

* * * * *